United States Patent [19]

Kumagai et al.

[11] Patent Number: 5,041,887
[45] Date of Patent: Aug. 20, 1991

[54] SEMICONDUCTOR MEMORY DEVICE

[75] Inventors: Jumpei Kumagai; Shizuo Sawada, both of Yokohama, Japan

[73] Assignee: Kabushiki Kaisha Toshiba, Kawasaki, Japan

[21] Appl. No.: 522,796

[22] Filed: May 14, 1990

[30] Foreign Application Priority Data

May 15, 1989 [JP] Japan ................ 1-121203

[51] Int. Cl.[5] ................ H01L 29/68; H01L 29/06; H01L 27/02
[52] U.S. Cl. ................ 357/23.6; 357/55; 357/42
[58] Field of Search ............ 357/23.6, 55, 42

[56] References Cited

U.S. PATENT DOCUMENTS

| | | | |
|---|---|---|---|
| 4,688,063 | 8/1987 | Lu et al. | 357/23.6 |
| 4,794,434 | 12/1988 | Pelley, III | 357/23.6 |
| 4,921,816 | 5/1990 | Ino | 357/23.6 |
| 4,922,313 | 5/1990 | Tsuchiya | 357/41 |

FOREIGN PATENT DOCUMENTS

| | | | |
|---|---|---|---|
| 84053 | 4/1986 | Japan | 357/23.6 |
| 113467 | 5/1987 | Japan | 357/23.6 |
| 207171 | 8/1988 | Japan | 357/23.6 |
| 209158 | 8/1988 | Japan | 357/23.6 |

*Primary Examiner*—Rolf Hille
*Assistant Examiner*—Robert P. Limanek
*Attorney, Agent, or Firm*—Banner, Birch, McKie & Beckett

[57] ABSTRACT

In one-transistor.one-capacitor type dynamic memory cell, cell capacitor with a reduced junction leakage current comprises a MOS capacitor which is provided between a semiconductor substrate and a charge storage electrode disposed at a side wall of a trench through a first insulating film, and a stacked capacitor which is provided between the charge storage electrode and a capacitor plate electrode formed on a second insulating film covering the entire surface of the charge storage electrode. The equivalent silicon dioxide thickness of the first insulating film is thicker than that of the second insulating film, and the storage capacitance of the cell capacitor is rendered by a sum of the capacitance of the MOS capacitor and the capacitance of the stacked capacitor because these capacitors are electrically connected in parallel with each other.

8 Claims, 4 Drawing Sheets

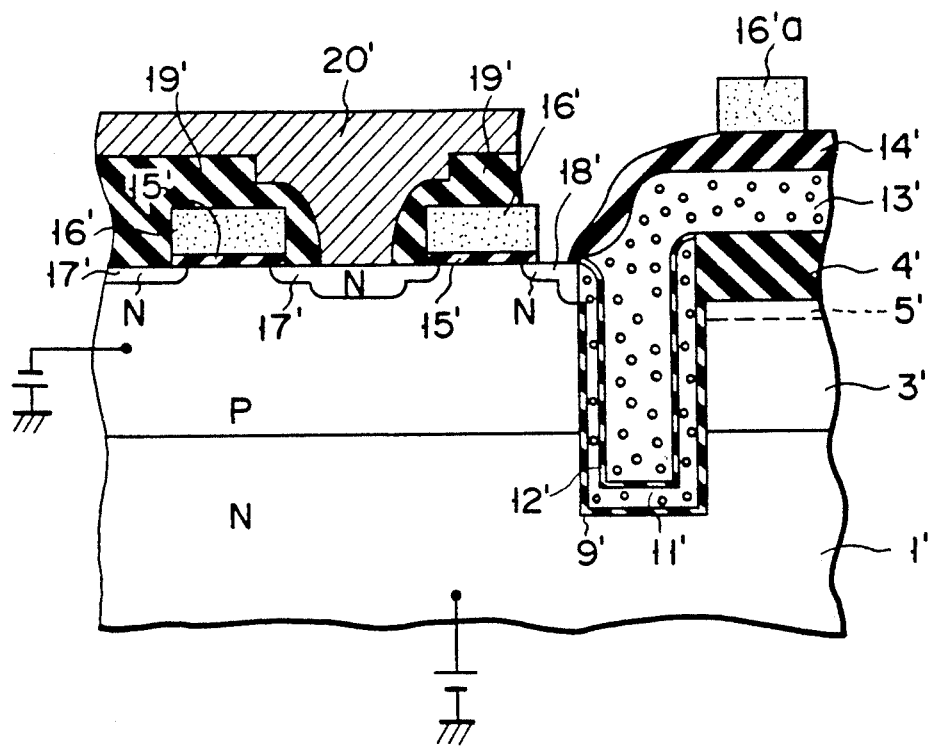
F I G. 4
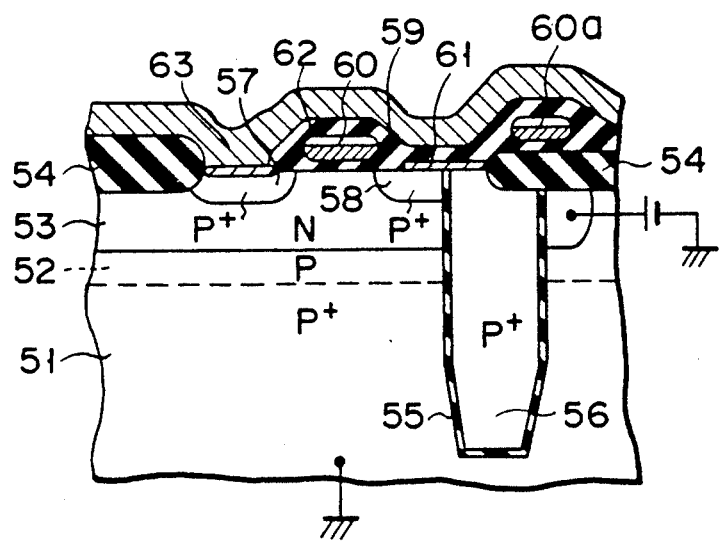
F I G. 5

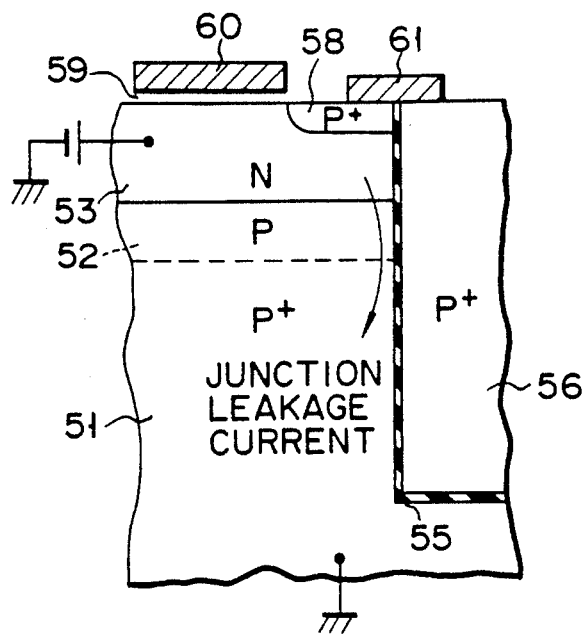
F I G. 6
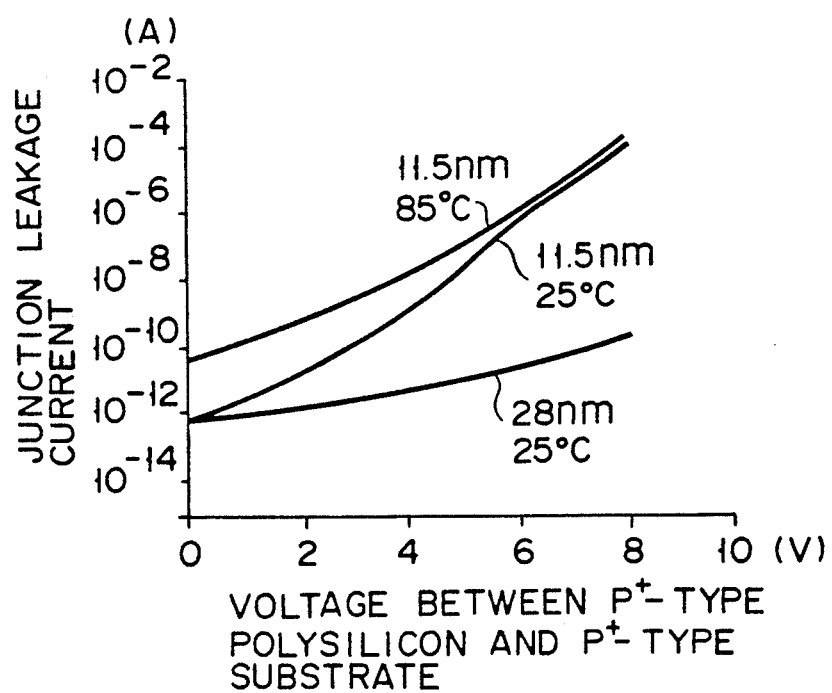
F I G. 7

SEMICONDUCTOR MEMORY DEVICE

BACKGROUND OF THE INVENTION

1. Field of the Invention

The present invention relates to a semiconductor memory device, and more particularly, to a structure of one-transistor.one-capacitor type dynamic memory cells.

2. Description of the Related Art

Various structures have been proposed as one-transistor.one-capacitor type dynamic memory cells for providing memory cell arrays so as to achieve high integration density. FIG. 5 shows an SPT cell as one such example. In an arrangement shown in FIG. 5, reference numeral 51 is a P+-type semiconductor substrate to which a ground potential Vss is applied. 52 a P-type epitaxial layer grown on the substrate 51, 53 an N-type well region provided in a part of a region of the epitaxial layer 52 and biased to a positive electric potential, and 54 an isolation region, respectively. A cell capacitor is provided as an insulated gate type capacitor (MOS capacitor) which includes a thin insulating film 55, formed on an inner surface of a trench extending to the substrate 51 through both the well region 53 and the epitaxial layer 52, and a P+-type polysilicon layer 56 for a charge storage electrode filled in the trench. In this case, the substrate 51 acts as a capacitor plate electrode.

A cell transistor for charge transfer is provided on the surface portion of the well region 53 and comprised of P+-type source and drain regions 57 and 58 formed in the well region 53 and a gate electrode 60 disposed through a gate insulating film 59 above a channel region defined between the source and drain regions. The upper surface of the drain region 58 is connected through a conductive film 61 to the polysilicon layer 56 in the trench. The gate electrode 60 is formed of, for example, silicides and serves as a part of a word line for the memory cell array. 60a is a word line for an adjacent row, 62 an interlevel insulator, and 63 a bit line which is in contact with the source region 57, respectively.

However, the dynamic memory cell has associated therewith a problem as described in more detail in the document "Parasitic Leakage in DRAM Trench Storage Capacitor Vertical Gated Diodes, W. P. Noble et al. IEDM 1987 Tech Digest, PP 340 to 343". That is, as shown in FIG. 6, since the insulating film 55 on the inner surface of the trench acts as a gate insulating film and the P+-type polysilicon layer 56 for the charge storage electrode acts as a control gate, a leakage current may flow through a junction between the N-type well region 53 and the P+-type substrate 51. In this case, the dependence of the junction leakage current associated with a voltage between the P+-type polysilicon layer 56 for the storage electrode and the P+-type substrate 51 will be obtained as shown in FIG. 7 when the ambient temperature and thickness of the insulating film 55 on the trench are used as parameters. From this it will be apparent that the junction leakage current is increased with a decrease in the thickness of the insulating film 55 on the inner surface of the trench.

However, the insulating film 55 on the inner surface of the trench should have decreased thickness in order to provide good memory cells and to obtain higher storage capacitance. In this case however the junction leakage current will be increased, thereby increasing the power consumption of the dynamic memory device.

As described above, the conventional dynamic memory cell involves the problem such that, even if the insulating film provided on the inner surface of the capacitor formation trench has reduced thickness so as to increase the storage capacitance of the memory cell, the junction leakage current between the well region and the substrate will be increased, thereby increasing the power consumption of the dynamic memory device.

Summary of the Invention

Accordingly, it is an object of the present invention to provide an improved cell capacitor in a one-transistor.one-capacitor type dynamic memory cell wherein a junction leakage current between a well region and a semiconductor substrate is reduced.

The object of the present invention is achieved by the following structure.

That is, the cell capacitor described above comprises a MOS capacitor provided between a semiconductor substrate and a charge storage electrode disposed above a side wall of a trench through a first insulating film, and a stacked capacitor provided between the charge transfer electrode and a capacitor plate electrode formed on a second insulating film covering the entire surface of the charge storage electrode. In the structure, the thickness of the first insulating film is thicker than that of the second insulating film. The storage capacitance of the cell capacitor is provided by the capacitance of the MOS capacitor and the capacitance of the stacked capacitor which are electrically connected in parallel with each other.

BRIEF DESCRIPTION OF THE DRAWINGS

The novel and distinctive features of the present invention are set forth in the claims appended to the present application. The present invention itself, however, together with further objects and advantages thereof may best be understood by reference to the following description and accompanying drawings in which:

FIG. 4 is a cross-sectional view showing a dynamic memory cell according to another embodiment of the present invention;

FIG. 5 is a cross-sectional view showing a conventional dynamic memory cell;

FIG. 6 is a cross-sectional view, partly enlarged, for explaining a junction leakage current between an N-type well and a P-type substrate in the conventional memory cell shown in FIG. 5; and FIG. 7 is a characteristic curve showing the dependence of the junction leakage current in FIG. 6 associated with a voltage between a P+-type polysilicon layer for a storage electrode and the P-type substrate.

DETAILED DESCRIPTION OF THE PREFERRED EMBODIMENTS

The embodiments of the present invention will be described below in detail with reference to the accompanying drawings.

Figure 1:
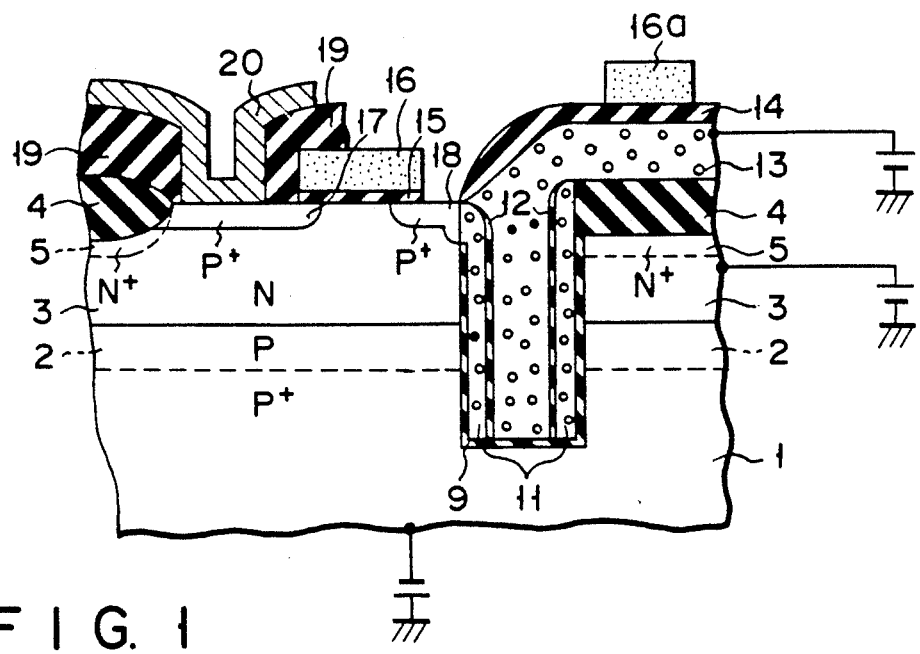
FIG. 1 is a cross-sectional view showing a dynamic memory cell according to one embodiment of the present invention.

A dynamic memory cell as shown in FIG. 1 is similar to the conventional dynamic memory cell described above with reference to FIG. 5, except that a stacked capacitor structure is used as a charge storage capacitor. That is, in the structure shown in FIG. 1, reference numeral 1 is a P+-type semiconductor substrate which is doped with an impurity to a high concentration of $1 \times 10^{18}$ to $1 \times 10^{21}$ cm$^{-3}$ to which a negative bias potential is applied. 2 is a P-type epitaxial layer grown on the substrate 1. 3 is an N-type well region formed in a part of a region of the epitaxial layer 2, to which a positive bias potential is applied. 4 is an isolation region.

A charge storage cell capacitor comprises a first insulating film 9 provided on an inner surface of a trench extending to the P+-type substrate 1 from the surface of the well region 3, a charge storage electrode 11 provided on the first insulating film 9 in the trench, a second insulating film 12 provided on the charge storage electrode 11 in the trench, and a capacitor plate electrode 13 which is provided on the second insulating film 12 in such a manner that a part of a polysilicon layer is filled in the trench. In the structure, the thickness of the first insulating film 9 is made thicker than that of the second insulating film 12. In this case, the thickness in the insulating films shows the equivalent silicon dioxide thickness.

A cell transistor for charge transfer is provided in and on the surface portion of the well region 3, which includes source and drain regions 17 and 18 formed in the well region 3 and a gate electrode 16 disposed through a gate insulating film 15 above a channel region provided between source and drain regions. The drain region 18 is electrically connected to the charge storage electrode 11. The gate electrode 16 is formed of, for example, a silicide layer and serves as a part of a word line for a memory cell array. 16a is a word line of an adjacent row, 19 an interlevel insulator, and 20 a bit line in contact with the source region 17, respectively.

A method of making the dynamic memory cell described above will be explained below with reference to FIGS. 2A to 2D.

Figure 2A:
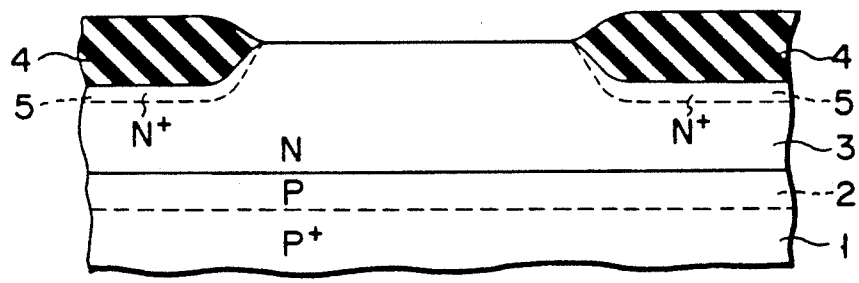
FIGS. 2A to 2D are cross-sectional views showing the steps of making the memory cell shown in FIG. 1.

First as shown in FIG. 2A, a P-type epitaxial layer 2 having a thickness of 1 to 4 μm is grown on a P+-type semiconductor substrate 1 which has been doped with an impurity to a high concentration of $1 \times 10^{18}$ to $1 \times 10^{21}$ cm$^{-3}$. Then, a phosphorus (P) ions are implanted into a region intended for memory cell formation and the substrate is subjected to thermal diffusion to provide an N-type well region 3. The surface concentration of the well region 3 is of the order of $5 \times 10^{16}$ to $5 \times 10^{17}$ cm$^{-3}$. An oxide film is selectively formed in the well region 3 by selective oxidation (LOCOS) techniques to provide a field oxide film 4 for an isolation region. In this case, an N+-layer 5 of high concentration is previously formed beneath the field oxide film 4 to prevent unwanted field inversion.

Figure 2B:
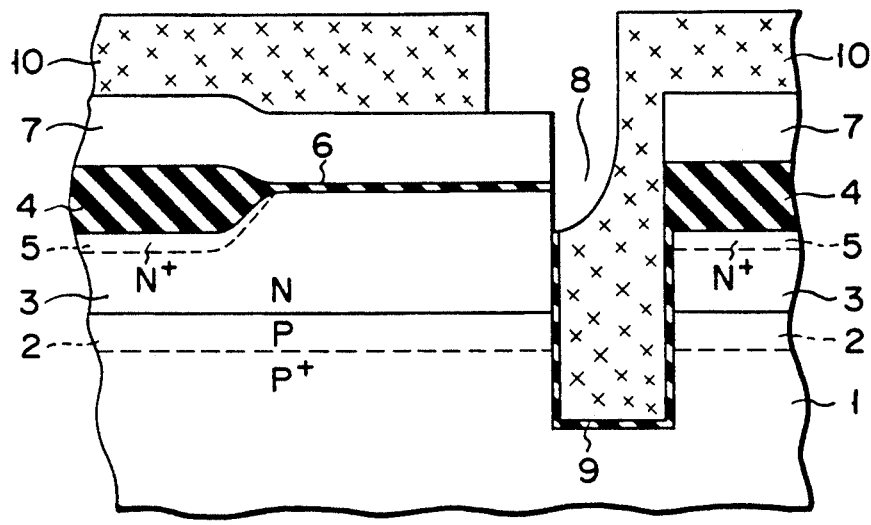

As shown in FIG. 2B, after a thermal oxide film 6 is formed on the substrate surface by a thermal oxidation process, a masking material such as a silicon nitride film 7 is deposited thereon and then patterned. Using the silicon nitride film 7 as a mask, the semiconductor substrate is subjected to anisotropic etching to provide a trench 8 extending to the P+-type substrate 1 through the well region 3 and epitaxial layer 2. A first oxide film 9 is formed on the inner surface of the trench 8 by, for example, thermal oxidation so as to obtain a first insulating film having an equivalent silicon dioxide thickness of 10 to 50 nm. After coating the substrate surface with a resist layer 10, it is patterned to a desired configuration. An upper end portion of the oxide film 9, located at an inside region of the trench 8, is selectively etched by an ammonium fluoride solution so as to expose a part of the upper portion of the well region 3.

Figure 2C:
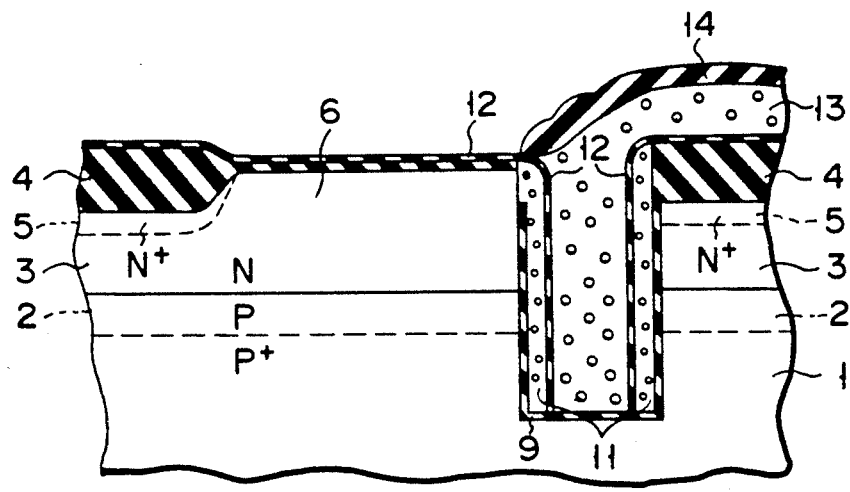

As shown in FIG. 2C, after the resist layer 10 and the mask 7 are removed from the substrate surface, a P-type doped polysilicon film is filled in the trench 8. The polysilicon film is selectively etched except only the inside region of the trench 8 to provide a charge storage electrode 11. In this case, a part of the charge storage electrode 11 may be in contact with the well region 3. A second oxide film 12 is formed on the surface of the charge storage electrode 11 by, for example, thermal oxidation so as to obtain a second insulating film having an equivalent silicon dioxide thickness of 5 to 10 nm. As oxide films 9 and 12, high dielectric films such as $Si_3N_4$, $Ta_2O_3$, $Y_2O_3$ and the like, or composite films thereof may be used instead of the silicon oxide film. After a P-type doped polysilicon film is deposited on the substrate surface so as to fill the trench 8 therewith, it is patterned to a desired configuration, thereby providing a capacitor electrode 13. An insulating film 14 is then formed on the plate electrode 13.

Figure 2D:
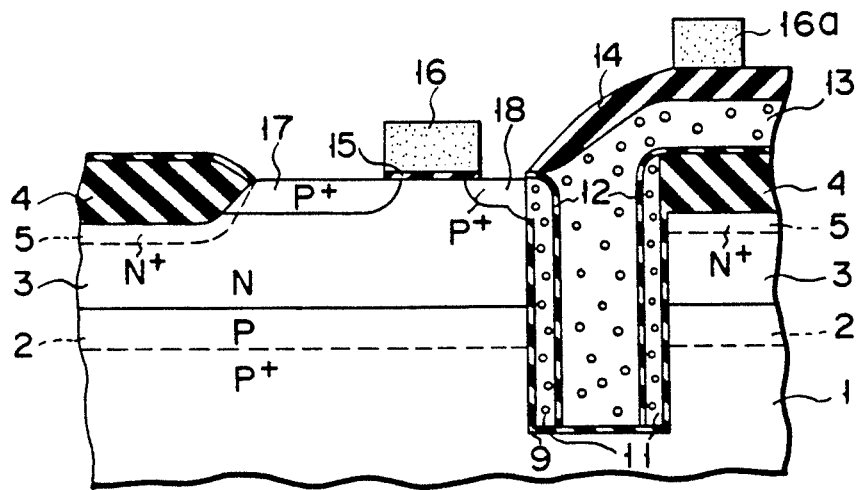

As shown in FIG. 2D, after selectively removing the insulating film 12 and the oxide film 6 provided on intended regions for cell transistor formation, a gate oxide film 15 and a gate electrode 16 are formed on the exposed well region 3. Boron (B) or boron fluoride (BF$_2$) ions are implanted into the well region to provide source and drain regions 17 and 18. In this case, the drain region 18 is in contact with the charge storage electrode 11.

After an interlevel insulator (19 in FIG. 1) is deposited on the substrate surface, a contact hole is cut therein and a bit line (20 in FIG. 1) is provided so as to be in contact with the source region 17.

Figure 3:
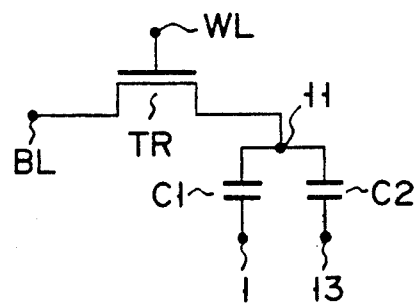
FIG. 3 shows an equivalent circuit of the memory cell shown in FIG. 1.

In the dynamic memory cell with the structure described above, the charge storage capacitor has a stacked capacitor structure. The storage capacitance C of the cell capacitor includes connected capacitors parallel C1 and C2 with the capacitance C1 of the MOS capacitor, provided by the charge storage electrode 11 provided in the trench, the first oxide film 9 and the P+-type substrate 1, and the capacitance C$_2$ of the stacked capacitor, provided by the charge storage electrode 11, the second oxide film 12 and the capacitor plate electrode 13. The equivalent circuit of the memory cell is one as shown in FIG. 3, where TR, WL and BL represent the charge transfer transistor, word line and bit line, respectively.

According to the dynamic memory cell, in order to obtain similar storage capacitance to that of the conventional device, the capacitance C$_1$ of the MOS capacitor can be decreased by the increased capacitance of the capacitance C$_2$ of the stacked capacitor. Therefore, the thickness of the first oxide film 9 in the trench can be increased by the increased capacitance. That is, when the size of the trench is kept constant, sufficient capacitance is not obtained in the conventional device unless the thickness of the insulating film (55 in FIG. 5) is, for example, 10 nm. In the embodiment described above, on the contrary, if the thickness of the second oxide film 12 of the stacked capacitor is 20 nm, the similar storage capacitance to that of the conventional device can be obtained even if the thickness of the first oxide film 9 of the MOS capacitor is increased to more than 20 nm, thereby reducing the junction leakage current between the well region 3 and the substrate 1. In this case, the thickness of the first oxide film 9 of the MOS capacitor may be increased while decreasing the thickness of the second oxide film 12 of the stacked capacitor, thereby reducing the junction leakage current.

According to the dynamic memory cell, since the thickness of the first oxide film 9 of the MOS capacitor is made thicker than that of the conventional device, the dielectric strength of the first oxide film 9 against the electric field stress can be improved.

It may be possible to increase the capacitance $C_2$ of the stacked capacitor much more and to decrease the capacitance $C_1$ of the MOS capacitor much more. In order to further decrease the capacitance $C_1$ of the MOS capacitor, the thickness of the first oxide film 9 of the MOS capacitor is not only made thick but also a P-type substrate having lower impurity concentration than that of the P+-type substrate 1 in the embodiment may be used. If, therefore, a P-type substrate having the similar impurity concentration ($1 \times 10^{15}$ to $1 \times 10^{18}$ cm$^{-3}$) to that of the P-type epitaxial layer 52 in the conventional device is used as a P-type substrate having the low impurity concentration, it may be unnecessary to use the P-type epitaxial layer 2 in the embodiment described above. According to the structure, the number of steps required for the manufacture of semiconductor devices can be reduced, thus ensuring a high yield at low cost.

The present invention is not limited to the embodiment described above, and it may be possible to replace P- and N-type regions by N- and P-type regions. As shown in FIG. 4, for example, without growing an epitaxial layer on an N-type substrate 1' having an impurity concentration $1 \times 10^{15}$ to $1 \times 10^{18}$ cm$^{-3}$, a P-type well region 3' is directly formed in a part of the N-type substrate 1'. Thereafter, a cell capacitor and a cell transistor may be provided. Therefore, the number of manufacturing processes can be reduced, thereby securing the high yield at low cost.

In the embodiment shown in FIG. 4, a positive bias potential is applied to the N-type substrate 1', and a negative bias potential is applied to the P-type well region 3'. The same reference numerals are employed in FIG. 4 to designate parts or elements corresponding to those shown in FIG. 1.

The present invention is further understood by those skilled in the art that the foregoing description is preferred embodiments of the disclosed device and that various changes and modifications may be made in the invention without departing from the spirit and scope thereof.

What is claimed is:

1. A semiconductor memory device including dynamic memory cells each being comprised of one transistor having source and drain regions and one cell capacitor, said transistor being provided in an opposite conductivity type well region formed in one conductivity type semiconductor substrate, said cell capacitor comprising:
   a trench provided in said semiconductor substrate through said well region;
   a first insulating film formed on an inner wall of said trench;
   a charge storage electrode disposed on said first insulating film, said charge storage electrode being electrically connected to one of said source and drain regions through only one upper end thereof;
   a second insulating film provided on said charge storage electrode, an equivalent silicon dioxide thickness of said first insulating film being thicker than that of said second insulating film to reduce an unwanted junction leakage current, said first and second insulating films being arranged to cover said charge storage electrode except said upper end; and
   a capacitor plate electrode disposed on said second insulating film, said capacitor plate electrode being insulated from said semiconductor substrate.

2. The semiconductor memory device according to claim 1, wherein said cell capacitor includes a MOS capacitor provided by said semiconductor substrate, said first insulating film and said charge storage electrode, and a stacked capacitor rendered by said charge storage electrode, said second insulating film and said capacitor plate electrode.

3. The semiconductor memory device according to claim 1, wherein said first insulating film is composed of a material selected from an $SiO_2$, an $Si_3N_4$, a $Ta_2O_3$, and a $Y_2O_3$ or a composite thereof.

4. The semiconductor memory device according to claim 1, wherein said second insulating film is composed of a material selected from an $SiO_2$, an $Si_3N_4$, a $Ta_2O_3$, and a $Y_2O_3$ of a composite thereof.

5. The semiconductor memory device according to claim 2, wherein the capacitance of said MOS capacitor is lower than that of said stacked capacitor.

6. The semiconductor memory device according to claim 2, wherein said MOS capacitor and said stacked capacitor are equivalently connected in parallel with each other.

7. The semiconductor memory device according to claim 1, wherein said one conductivity type semiconductor substrate comprises one conductivity type epitaxial layer with a comparatively low impurity concentration grown on one conductivity type semiconductor substrate having an impurity concentration of $1 \times 10^{18}$ to $1 \times 10^{21}$ cm$^{-3}$.

8. The semiconductor memory device according to claim 1, wherein said one conductivity type semiconductor substrate comprises only one semiconductor substrate of one conductivity type having an impurity concentration of $1 \times 10^{15}$ to $1 \times 10^{18}$ cm$^{-3}$.

* * * * *